United States Patent

Choi

[11] Patent Number: 5,837,608
[45] Date of Patent: Nov. 17, 1998

[54] METHOD OF FILLING A CONTACT HOLE IN A SEMICONDUCTOR DEVICE USING VERTICAL GROWTH OF METAL

[75] Inventor: Kyeong Keun Choi, Suwon, Rep. of Korea

[73] Assignee: Hyundai Electronics Industries Co., Kyungki-Do, Rep. of Korea

[21] Appl. No.: 882,049

[22] Filed: Jun. 25, 1997

[30] Foreign Application Priority Data

Jun. 28, 1996 [KR] Rep. of Korea ............... 96-24939

[51] Int. Cl.$^6$ ................................................. H01L 21/44
[52] U.S. Cl. ..................... 438/675; 438/672; 438/639; 148/DIG. 19
[58] Field of Search ................... 438/639, 672–675; 148/DIG. 19

[56] References Cited

U.S. PATENT DOCUMENTS 5,260,232 11/1993 Muroyama et al. .
5,502,008 3/1996 Hayakawa et al. .

Primary Examiner—Jey Tsai
Attorney, Agent, or Firm—Scott C. Harris, Esq.

[57] ABSTRACT

The present invention discloses a method of forming a plug in a semiconductor device. Metals having different properties are employed to induce the growth of the metals in fixed direction within the contact hole so as to prevent an over-etching which is generated due to a difference of density depending on the growth direction of the metal in the contact hole. Upon a full-surface etching process for forming a plug, the step difference generating on top of the contact hole can be minimized, thereby improving the step coverage of the metal during a subsequent metalization process and increasing the electrical characteristic and reliability of the device.

7 Claims, 4 Drawing Sheets

5,837,608

METHOD OF FILLING A CONTACT HOLE IN A SEMICONDUCTOR DEVICE USING VERTICAL GROWTH OF METAL

BACKGROUND OF THE INVENTION

1. Field of the Invention

The present invention relates to a method of forming a plug in a semiconductor device and, more particularly, to a method of forming a plug in a semiconductor device which can improve the step coverage of a metal.

2. Description of the Prior Arts

Generally, the junction and a metal wire or a lower metal wire and an upper metal wire, which are formed in a silicon substrate, are interconnected through a contact hole or a via hole. Since the size of the contact hole is reduced as a higher integration of the semiconductor device, the step coverage of a metal in the contact hole is accordingly degraded. In order to solve this problem, a metal such as tungsten (W) is buried within the contact hole to form a plug, then a process of forming a metal layer is performed.

Conventional method of forming a plug is described by reference to the FIGS. 1A through 1C.

FIGS. 1A through 1C are cross-sectional views of device for explaining a conventional method of forming a plug in a semiconductor device.

Referring to 1A, an insulating layer 3 is formed on a silicon substrate 1 in which a junction 2 is formed. A portion of the insulating layer 3 is etched to form a contact hole 6, thus the junction 2 is exposed. A barrier metal layer 4 is formed on the entire structure including the contact hole 6. The barrier metal layer 4 is formed by sequentially depositing titanium (Ti) and titanium nitride (TiN)

In FIG. 1B, a tungsten layer 5 is formed on the barrier metal layer 4 by performing a tungsten deposition process until the contact hole 6 is completely buried.

The tungsten layer 5 is grown perpendicularly to the surface of the barrier metal layer 4 as shown in FIG. 2 which is enlarged view of the contact hole 6 of FIG. 1B. That is, the tungsten layer 5 formed on bottom surface of the contact hole 6 is grown upwardly, and tungsten layer 5 formed at side walls of the contact hole 6 is grown horizontally. Therefore, the tungsten layer 5 at the center of the contact hole 6 is not dense relatively.

Referring to FIG. 1C, the tungsten layer 5 is etched completely until the barrier metal layer 4 formed on the insulating layer 3 is exposed, thereby forming a tungsten plug 5A within the contact hole 6. Since the density of the tungsten layer 5 corresponded to the center of the contact hole 6 is lowest as described above, the center portion of the tungsten layer 5 within the contact hole 6 is over-etched during the etching process of the tungsten layer 5. Therefore, during a subsequent metalization process, the step coverage of the metal is degraded. As a result, it causes a problem to degrade an electrical characteristic and reliability of the device.

SUMMARY OF THE INVENTION

It is therefore an object of the present invention to provide a method of forming a plug in a semiconductor device.

In the present invention, the metals having different properties from each other are employed to induce the growth of the metals in fixed direction within the contact hole. A density of the metal layer grown in the contact hole becomes uniform, thus, an over-etching which is generated due to the difference of density depending on the growth direction of the metal layer in the contact hole is prevented.

In order to achieve this object, the present invention comprises the steps of forming a contact hole in a silicon substrate on which an insulating layer is formed; forming a barrier metal layer on the entire structure including the contact hole; forming a first metal layer on the barrier metal layer; forming a second metal layer on the first metal layer; etching the second metal layer to form a second metal layer spacer on the first metal layer at the side wall of said contact hole; forming a third metal layer on the first metal layer including the second metal layer spacer until the contact hole is completely buried; and etching the third and first metal layers to expose the barrier metal layer formed on the insulating layer, thereby forming a metal plug within the contact hole. The first and third metal layers are formed from the group consisting of aluminum (Al), copper (Cu), and tungsten (W), the first and third metal layers are formed of same materials. The second metal layer is formed from the group consisting of titanium nitride (TiN), ruthenium (Ru), ruthenium oxide ($RuO_2$), and tungsten nitride ($WN_2$).

BRIEF DESCRIPTION OF THE DRAWINGS

Other objects and advantages of the present invention will be understood by reading the detailed explanation of the embodiment with reference to the accompanying drawings in which.

DESCRIPTION OF THE INVENTION

One embodiment of the present invention will be explained in detail below by reference to the accompanying drawings.

FIGS. 3A through 3E are cross-sectional views of device for explaining a method of forming a plug in a semiconductor device according to the present invention.

Figure 1A:
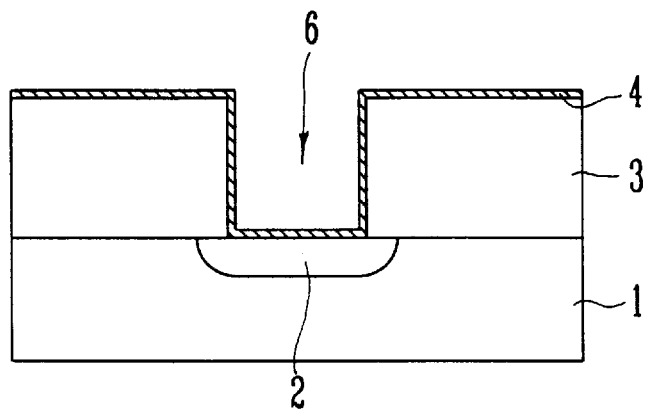
FIGS. 1A through 1C are cross-sectional views of device for explaining a conventional method of forming a plug in a semiconductor device.
Figure 1B:
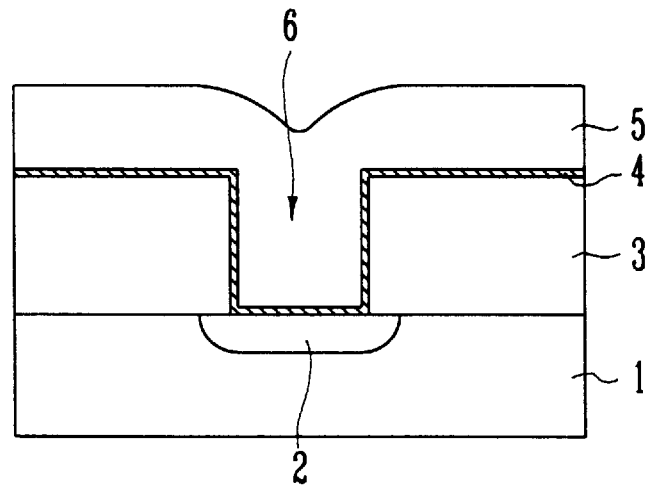
Figure 1C:
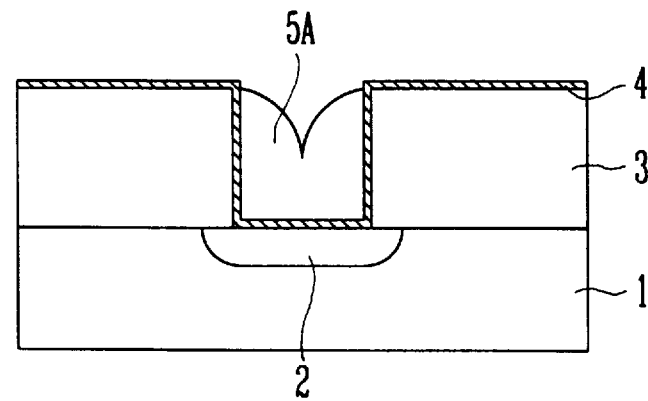
Figure 2:
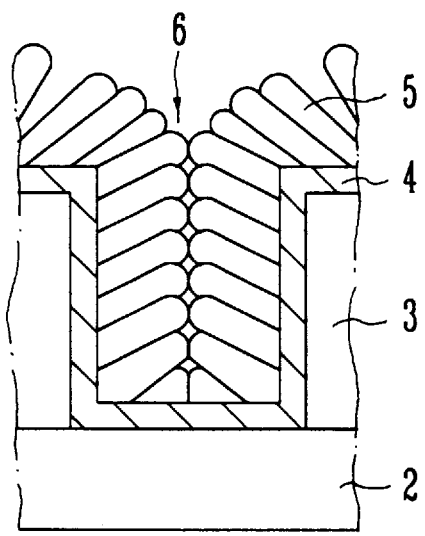
FIG. 2 is an enlarged view of a contact hole in FIG. 1B.
Figure 3A:
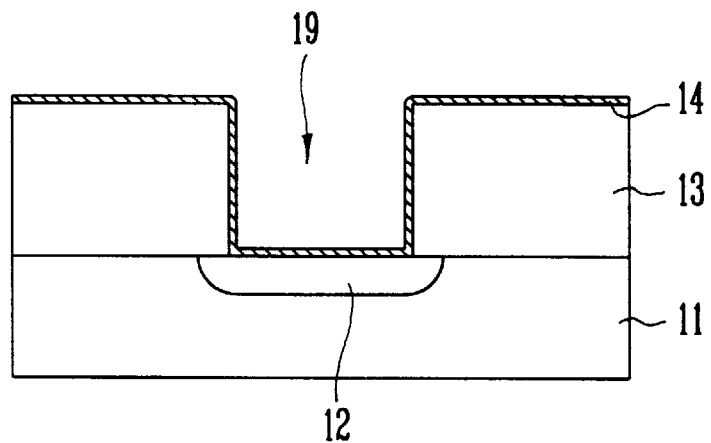
FIGS. 3A through 3E are cross-sectional views of device for explaining a method of forming a plug in a semiconductor device according to the present invention.

Referring to FIG. 3A, an insulating layer 13 is formed on a silicon substrate 11 on which a junction 12 is formed. A portion of the insulating layer 13 is etched to form a contact hole 19, therefore, the junction 12 is exposed. A barrier metal layer 14 is formed on the entire structure including the contact hole 19. The barrier metal layer 14 is formed by sequentially depositing titanium (Ti) and titanium nitride (TiN).

Figure 3B:
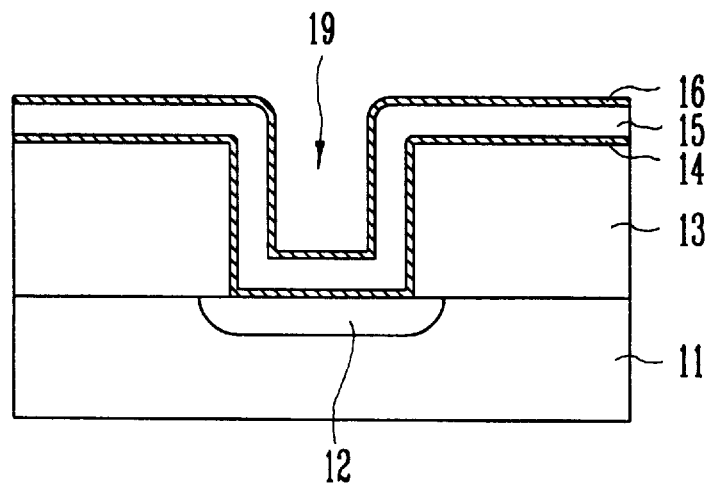

In FIG. 3B, a first metal layer 15 is formed on the barrier metal layer 14, a second metal layer 16 is formed on the first metal layer 15. The first metal layer 15 is formed from the group consisting of aluminum (Al), copper (Cu), and tungsten (W). The second metal layer 16 is formed from the group consisting of titanium nitrite (TiN), ruthenium (Ru), ruthenium oxide ($RuO_2$) and tungsten nitride ($WN_2$). The first and the second metal layers 15 and 16 are formed by either a chemical vapor deposition method or a physical vapor deposition method.

Figure 3C:
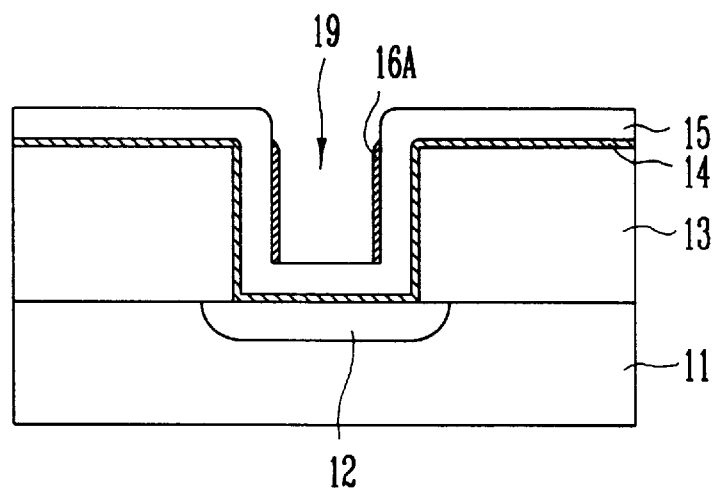
Figure 3D:
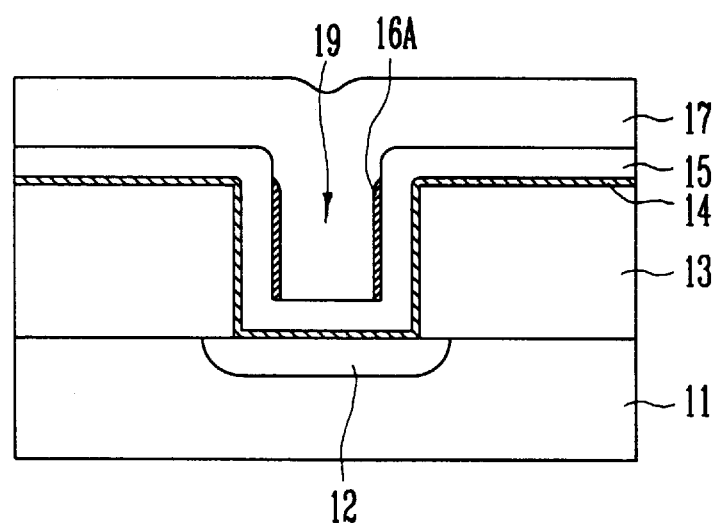

Referring to FIGS. 3C and 3D, the second metal layer 16 is fully etched to form a second metal layer spacer 16A on the first metal layer 15 formed at the side walls of the contact hole 19. A third metal layer 17 for forming a plug is formed on the first metal layer 15 and the second metal layer spacer 16A by performing a deposition process until the contact hole 19 is completely buried. The third metal layer 17 is formed from the group consisting of aluminum (Al), copper (Cu) and tungsten (W) which consists the first metal layer 15.

Figure 4:
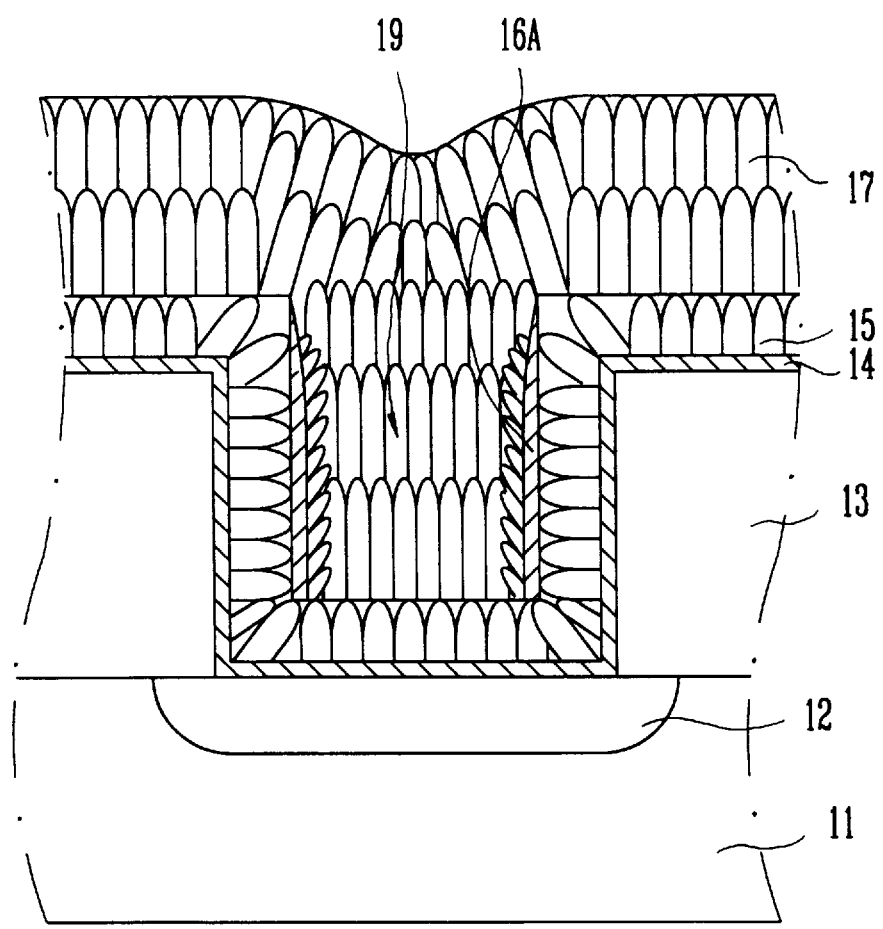
FIG. 4 is an enlarged view of a contact hole in FIG. 3D.

As shown in FIG. 4 which is an enlarged view of a contact hole in FIG. 3D, the third metal layer 17 is rarely grown at the second metal layer spacer 16A which is made of different material with the third metal layer 17. However, the third metal layer 17 which is formed on the first metal layer 15 and is made of same materials as the materials consisting the first metal layer 15 is grown quickly at the first metal layer 15. Accordingly, the most of the third metal layer 17 is grown vertically within the contact hole 19, a density of the third metal layer 17 within the contact hole 19 is uniform.

Figure 3E:
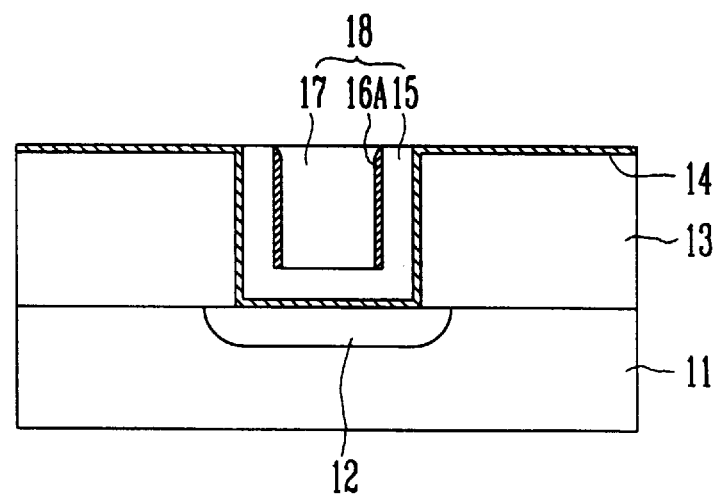

Referring to FIG. 3E, the third and first metal layers 17 and 15 are fully etched until the barrier metal layer 14 formed on the insulating layer 13 is exposed, therefore, a metal plug 18 consisted of the first metal layer 15, the second metal spacer 16A and the third metal layer 17 is formed within the contact hole 19.

As described above, since the density of the third metal layer 17 within the contact hole 19 is uniform, the third metal layer 17 can be etched uniformly. Consequently, the surface of the metal plug 19 formed by an etching-back process is planarized, the step coverage of the metal plug 19 can be improved during a subsequent metalization process.

In the present invention, if the total thickness of the first, the second and the third metal layers 15, 16 and 17 deposited to form the metal plug 18 is about 5,000 Å, it is desired that the first metal layer 15 is formed in thickness of about 700–1,700 Å which is one seventh (1/7) through one third (1/3) of the total thickness, the second metal layer 16 is formed in thickness of about 100–500 Å, and the third metal layer 17 is formed with a remaining thickness.

In order to prevent a growth of the third metal layer 17 at the second metal layer spacer 16A, the third metal layer 17 is deposited at lower temperature than the temperature at which the first metal layer 15 made of the same materials as the third metal layer 17 is deposited. For example, if the first and the third metal layers 15 and 17 are formed with tungsten, the first metal layer 15 is deposited at temperature of about 450 degree Celsius, and the third metal layer 17 is deposited at temperature of about 300 degree Celsius.

As mentioned above, in the present invention, the metals having different properties from each other are employed to induce the growth of the metal in fixed direction within the contact hole. Therefore, a density of the metal layer grown in the contact hole becomes uniform, and an over-etching which is generated due to the difference of density depending on the growth direction of the metal layer in the contact hole is prevented. Consequently, upon an etching back process for forming the plug, the step difference generating on upper portion of the contact hole can be minimized, thereby improving the step coverage of the metal plug after a subsequent metalization process and increasing the electrical characteristic and reliability of the device.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of filling a contact hole in a semiconductor device using vertical growth of metal, comprising the steps of:

forming a contact hole in a silicon substrate on which an insulating layer is formed;

forming a barrier metal layer on the entire semiconductor device including said contact hole;

forming a first metal layer on said barrier metal layer, wherein said fist metal layer is made of a different material than said metal layer;

forming a second metal layer on said first metal layer, wherein said second metal layer is made of a different material said first metal layer;

etching a portion of said second metal layer to form a second metal layer spacer on said first metal layer at a side wall of said contact hole, thereby exposing a portion of said first metal layer at the bottom of said contact hole;

forming a third metal layer on said first metal layer including said second metal layer spacer until said contact hole is completely buried, wherein said third metal layer is made of the same material as said first metal layer and is grown vertically from the bottom of said contact hole; and etching said third and first metal layers to expose said barrier metal layer formed on said insulating layer, thereby forming a metal plug within said contact hole.

2. The method of claim 1, wherein said barrier metal layer is formed by sequentially depositing titanium (Ti) and titanium nitride (TiN).

3. The method of claim 1, wherein said first and third metal layers are formed from materials from the group consisting of aluminum (Al), Copper (Cu), and Tungsten (W).

4. The method of claim 1, wherein said second metal layer is formed from any one selected group consisting of titanium nitride (TiN), ruthenium (Ru), ruthenium oxide (RuO$_2$), and tungsten nitride (WN$_2$).

5. The method of claim 1, wherein said third metal layer is formed at a deposition temperature which is lower than a deposition temperature of said first metal layer.

6. The method of claim 1, wherein said first metal layer is formed in thickness of one seventh through one third of the total thickness of said first, second and third metal layers.

7. The method of claim 1, wherein said second metal layer is formed in thickness of about 100–500 Å.

* * * * *